United States Patent Office 3,180,732

Patented Apr. 27, 1965

3,180,732

LIGHT SENSITIVE IMINOQUINONE DIAZIDE AND MATERIAL FOR THE PHOTOMECHANICAL PREPARATION OF PRINTING PLATES THEREWITH

Oskar Sus and Johannes Munder, Wiesbaden-Biebrich, and Hartmut Steppan, Wiesbaden-Dotzheim, Germany, assignors, by mesne assignments, to Azoplate Corporation, Murray Hill, N.J.

No Drawing. Filed July 24, 1963, Ser. No. 297,237
Claims priority, application Germany, Sept. 1, 1959, K 38,592
18 Claims. (Cl. 96—33)

In presensitized material useful for the photomechanical preparation of printing plates, the o-quinone diazides and p-quinone diazides, including in particular those substituted in the nucleus by sulfonic acid ester or sulfonamide groups, have attained industrial importance, and also the iminoquinone diazides. As a result of the pronounced light-sensitivity thereof, iminoquinone diazides of the benzene series, derived from a 1,4-phenylene diamine substituted in an amino group by an aryl sulfonyl radical, which togther with other iminoquinone diazides are described in German Patent 901,500, have proved very satisfactory. When exposed to light, the iminoquinone diazides are converted to products of high molecular weight which are more difficultly soluble in dilute alkalis, dilute acids, or organic solvents than are the iminoquinone diazides themseves. This property provides the basis for the suitability of these compounds for the production of images and the preparation of printing plates since, after reproduction coatings prepared therewith have been exposed under a master to light, the remaining light-sensitive portion can be selectively separated from the light decomposition product, using the developers described above. From a negative original, positive images or printing plates are obtained, and vice versa.

In further work on iminoquinone diazides as light sensitive compounds, a reproduction material containing iminoquinone diazides in the coating has been found which is particularly suitable for the preparation of images or printing plates. In this material, the iminoquinone diazides which constitute the reproduction coating, or which are contained therein, correspond to the general formula

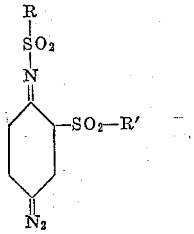

In this formula R is an aryl or substituted aryl radical, and R′ is a member selected from the group consisting of the residue NH—R″, in which R″ is a heterocyclic radical, and heterocyclic residues.

The distinguishing feature of the particular iminoquinone diazide compounds of the invention is the —$SO_2$—R′ sulfamine radical substituted in the amino group and attached in the ortho position to the aryl sulfonyl radical. The technical advance involved in the use of the iminoquinone diazides corresponding to the general formula given above resides in the greater stability of these compounds, as it is considerably greater than that of the iminoquinone diazides described in German Patent 901,500. The reproduction material of the invention is thus a light sensitive material with excellent shelf life from which very stable images and printing plates giving very long runs can be prepared.

Exemplary of the compounds of the invention are:

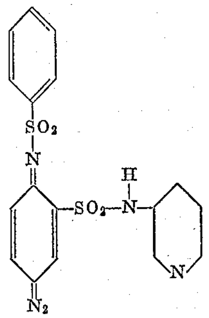

Formula 1

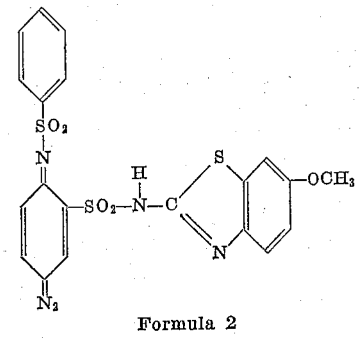

Formula 2

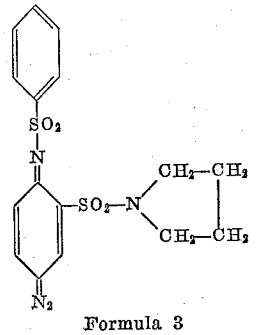

Formula 3

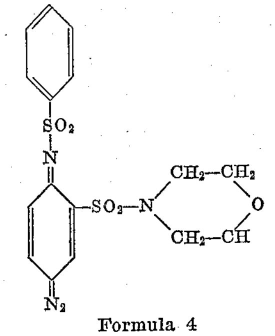

Formula 4

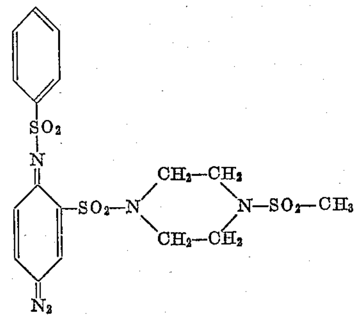

Formula 5

The iminoquinone diazides of the invention are, for practical purposes, insoluble in water but are soluble in organic solvents. They are applied in known manner, in solution in organic solvents, to suitable supports, e.g. metal plates or metal foils, preferably aluminum or zinc, or paper. It can be advantageous if resins, preferably alkali-soluble resins, are applied in association with the light sensitive compounds to the surface of the supports. They favor film-formation and increase the adherence of the image, i.e. the printing image remaining on the support after the development of the exposed reproduction coating, because the light reaction products of the iminoquinone diazides react with the resins which are capable of being anchored to the supports. For example, the phenol formaldehyde resin novolaks commercially available under the registered trademark "Alnovol" and the conversion products obtained therefrom by etherification with chloroacetic acid have proved to be very suitable resins for this purpose. Processes of preparation for these etherification products are described in detail in German patent specification No. 1,053,930, in Example 5.

For special effects, e.g. to prevent crystallization in the reproduction coating and/or to increase resistance to the developer, it may be advantageous for mixtures of the iminoquinone diazide compounds of the ivention to be used in the light sensitive coating.

For the preparation of a printing plate from the presensitized material of the invention, the reproduction material is exposed to light under a master. The image formed is at first barely visible. It becomes clearer only after development, when it becomes a pale yellow color. If dyestuffs are added to the coatings, the images have the color of the dyestuffs; this has the advantage that the development process can be better followed. Dyestuff additions do not interfere in any way with the process, because it is only with the light decomposition products that the dyestuffs form precipitation products during development which are insoluble, and not with the light sensitive substance. Here, too, dilute alkalis are suitable as developers, e.g., solutions of alkali metal salts of phosphoric acid and the alkali metal salts of the various forms of silicic acid. Organic bases, e.g. the ethanol amines, in the form of aqueous solutions thereof, may also be used as developers. In some cases, good results may also be obtained by using acid developers, e.g. dilute aqueous solutions of phosphoric acid, to which small amounts of water-soluble, organic solvents may be added, e.g. ethylene glycol monomethyl ether.

In the case of development with solutions containing alkali silicate, water-conduction in the image-free parts of the surface of the support is adequate after the alkaline treatment, so that further treatment with dilute acids, such as is usually performed in the printing trade, is not necessary.

The light decomposition products of the iminoquinone diazides of the invention are characterized by excellent oleophilic properties and they accept greasy ink with great facility. This is of great technical importance because the printing plates once ready for printing will give full-value copies after only a few turns of the roller of the rotary printing machine.

The iminoquinone diazides corresponding to the formula given above are obtained by the following processes:

(1) 1-chloro-4-nitro-benzene-2-sulfochloride is reacted with an aromatic base, as a result of which the 1-chloro-4-nitro-benzene-2-sulfarylamides are formed. These intermediate products are condensed in solvents with aryl sulfonamides, in the presence of copper powder and alkali carbonate. The chlorine in the one-position is thus replaced by the aryl sulfonamide residue. The nitro compounds obtained can be reduced by known processes, e.g. by means of sodium dithionite, and the amines thus obtained are diazotized in water-miscible solvents, e.g. in a mixture of dimethyl formamide and glacial acetic acid. The iminoquinone diazides, for the most part, precipitate out in the form of sparingly soluble compounds, or they can be precipitated by the addition of water.

(2) 4-nitro-1-amino-benzene-2-sulfonic acid is reacted with aromatic sulfochlorides and the 1-aryl-sulfamino-4-nitro-2-benzene-sulfonic acids thus obtained are converted into sulfo chlorides which are then reacted with aromatic bases. The nitro compounds thus obtained are further processed as described above under (1).

The list below gives:

In Column 1—the number of the compound in the formula table above,

In Column 2—the R constituent,

In Column 3—the R′ constituent,

In Column 4—the decomposition point of the iminoquinone diazide (in centigrades), In Column 5—the percentage content of active substance in the aqueous developer, and Column 6 gives the most advantageous developer for a reproduction coating containing the iminoquinone diazide in question as the light sensitive substance, the letter A standing for sodium metasilicate and B for trisodium phosphate.

| 1 | 2 | 3 | 4 | 5 | 6 |
|---|---|---|---|---|---|
| | | | ° C. | *Percent* | |
| 1 | Phenyl | Pyridyl-(2)-amino | ~164 | 0.125 | B |
| 2 | do | 6-methoxy-benzthiazolyl-(2)-amino. | ~217 | 0.5 | A |
| 3 | do | Pyrrolidino | ~164 | 0.5 | B |
| 4 | do | Morpholino | | 0.5 | B |
| 5 | do | Mono-methane-sulfonyl-piperazino. | 174 | 0.25 | B |

The invention will be further illustrated by reference to the following specific example:

*Example*

One part by weight of the diazo compound 1-benzenesulfonyl - imino-2-(pyrrolidino - sulfonyl)-benzoquinone-(1,4)-diazide-(4) corresponding to Formula 4 and 0.3 part by weight of a condensation product of phenol formaldehyde novolak and chloroacetic acid, e.g. a condensation product obtained from the phenol formaldehyde resin "Alnovol" and chloroacetic acid by the process described in Example 5 of German patent specification No. 1,053,930, are dissolved in a mixture made up of 80 parts by volume of methyl glycol and 20 parts by volume of dimethylformamide. A mechanically roughened aluminum foil is coated with this solution on a plate whirler and subsequently dried at 100° C. After exposure under a transparent negative master, development with a 0.5 percent aqueous solution of trisodium phosphate, wiping over with 1 percent phosphoric acid, and inking with greasy ink, a positive printing plate is obtained which is capable of long runs.

For the preparation of the diazo compound corresponding to Formula 4, 4-nitro-1-amino-benzene-2-sulfonic acid is condensed with benzene sulfochloride in pyridine, the condensation product obtained is isolated in the form of the sodium salt, and the latter is reacted with phosphorus pentachloride to form the 4-nitro-1-benzenesulfonylamino-benzene-2-sulfonic acid chloride. This compound is reacted in known manner with piperidine. The nitro compound (melting point 145–146° C.) is dissolved in a dilute solution of sodium hydroxide and the boiling solution is reduced by addition of sodium dithionite. The resulting amine is precipitated from the mixture by addition of acetic acid, filtered by suction, and recrystallized from methanol, the crystals melting at 174–175° C.

The amine is dissolved in a mixture of equal parts of dimethyl formamide and acetic acid and, at a temperature below +5° C., is diazotized by addition of a 40 percent solution of sodium nitrite in water. The resulting diazo compound is precipitated by addition of water, filtered by suction, and purified by dissolving the dry product in acetone and reprecipitation by adding ether.

The diazo compound forms yellow crystals which melt at about 164° C. (with decomposition).

This application is a continuation-in-part of our copending application Serial No. 50,317, filed August 18, 1960.

It will be obvious to those skilled in the art that many modifications may be made within the scope of the present invention without departing from the spirit thereof, and the invention includes all such modifications.

What is claimed is:

1. A compound having the formula

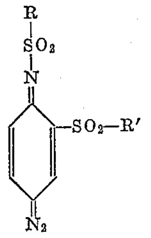

in which R is an aryl group, R′ is a member selected from the group consisting of the residue —NH—R″, in which R″ is a heterocyclic group, and heterocyclic residues wherein a nitrogen atom of the heterocyclic residue is directly attached to the $SO_2$ group.

2. A compound having the formula

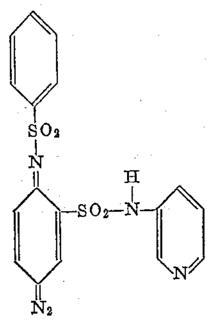

3. A compound having the formula

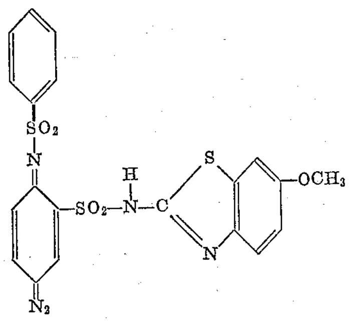

4. A compound having the formula

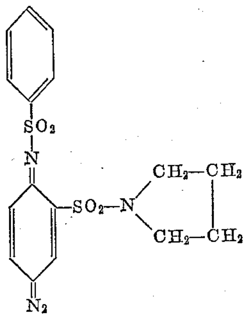

5. A compound having the formula

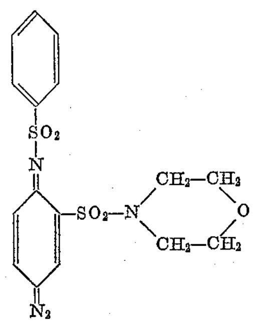

6. A compound having the formula

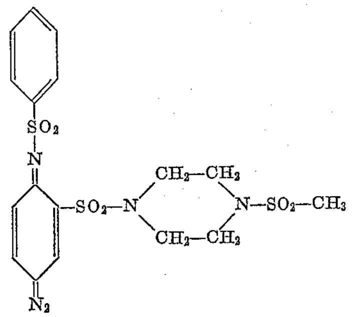

7. A presensitized printing plate comprising a base material having a coating thereon, the coating comprising a compound having the formula

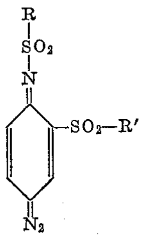

in which R is an aryl group, and R′ is a member selected from the group consisting of the residue —NH—R″, in which R″ is a heterocyclic group, and heterocyclic residues wherein a nitrogen atom of the heterocyclic residue is directly attached to the $SO_2$ group.

8. A presensitized printing plate comprising a base material having a coating thereon, the coating comprising a compound having the formula

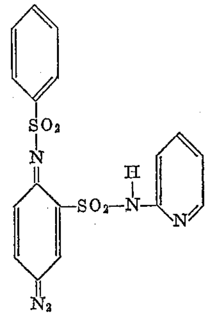

9. A presensitized printing plate comprising a base material having a coating thereon, the coating comprising a compound having the formula

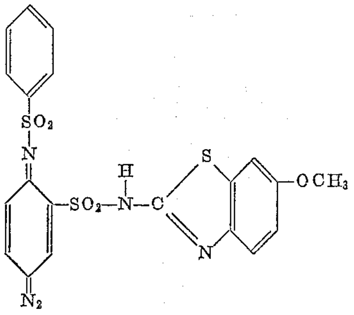

10. A presensitized printing plate comprising a base material having a coating thereon, the coating comprising a compound having the formula

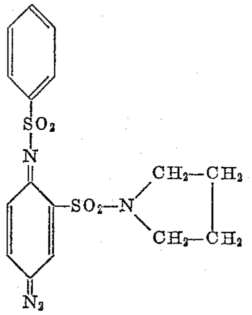

11. A presensitized printing plate comprising a base material having a coating thereon, the coating comprising a compound having the formula

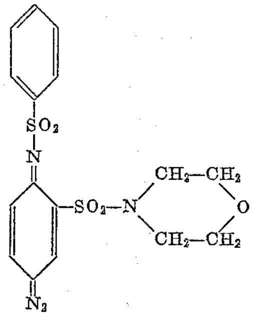

12. A presensitized printing plate comprising a base material having a coating thereon, the coating comprising a compound having the formula

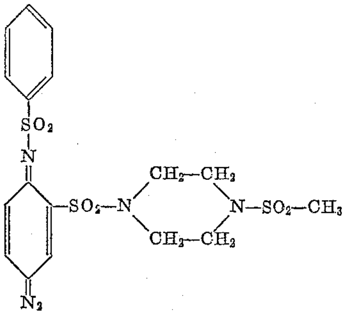

13. A process for making a printing plate which comprises exposing a coated base material to light under a master, the coating comprising a compound having the formula

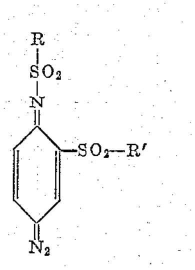

in which R is an aryl group, and R′ is a member selected from the group consisting of the residue —NH—R″, in which R″ is a heterocyclic group, and heterocyclic residues wherein a nitrogen atom of the heterocyclic residue is directly attached to the $SO_2$ group, and treating the exposed coating with a developing solution.

14. A process for making a printing plate which comprises exposing a coated base material to light under a master, the coating comprising a compound having the formula

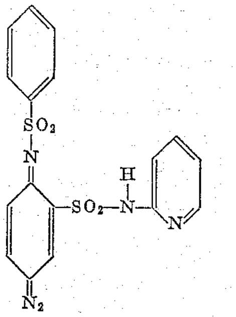

and treating the exposed coating with a developing solution.

15. A process for making a printing plate which comprises exposing a coated base material to light under a master, the coating comprising a compound having the formula

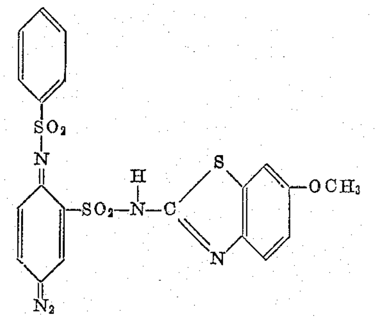

and treating the exposed coating with a developing solution.

16. A process for making a printing plate which comprises exposing a coated base material to light under a master, the coating comprising a compound having the formula

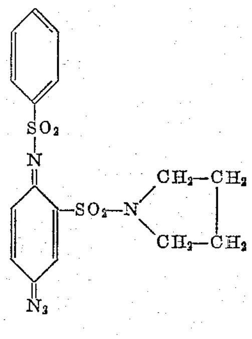

and treating the exposed coating with a developing solution.

17. A process for making a printing plate which comprises exposing a coated base material to light under a master, the coating comprising a compound having the formula

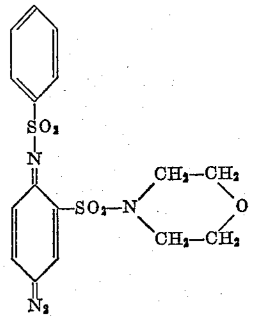

and treating the exposed coating with a developing solution.

18. A process for making a printing plate which comprises exposing a coated base material to light under a master, the coating comprising a compound having the formula

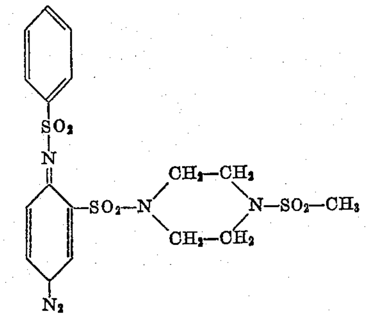

and treating the exposed coating with a developing solution.

No references cited.

NORMAN G. TORCHIN, *Primary Examiner.*